United States Patent
Lo Muzzo et al.

(10) Patent No.: US 10,928,425 B2
(45) Date of Patent: Feb. 23, 2021

(54) HIGH-SPEED AFE FOR CURRENT MONITORING APPLICATIONS

(71) Applicant: STMicroelectronics S.r.l., Agrate Brianza (IT)

(72) Inventors: Valerio Lo Muzzo, Milan (IT); Alberto Gussoni, Cornaredo (IT); Ambrogio Bogani, Limbiate (IT); Fabrizio Martignoni, Morazzone (IT); Mattia Fausto Moretti, Monza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 49 days.

(21) Appl. No.: 16/460,680

(22) Filed: Jul. 2, 2019

(65) Prior Publication Data
US 2021/0003619 A1  Jan. 7, 2021

(51) Int. Cl.
*G01R 19/00* (2006.01)
*G01R 19/165* (2006.01)
*H03F 1/52* (2006.01)
*H03F 1/22* (2006.01)

(52) U.S. Cl.
CPC ......... *G01R 19/16533* (2013.01); *H03F 1/22* (2013.01); *H03F 1/523* (2013.01)

(58) Field of Classification Search
CPC ........ G01R 19/16533; G01R 19/16566; G01R 19/16571; G01R 19/0092; G01R 31/2805; G01R 31/2812; G01R 31/2884; G01R 31/2853
See application file for complete search history.

(56) References Cited

U.S. PATENT DOCUMENTS

| | | | |
|---|---|---|---|
| 5,498,984 A | 3/1996 | Schaffer | |
| 6,492,845 B1 * | 12/2002 | Ge | H03F 1/22 327/53 |
| 6,621,259 B2 | 9/2003 | Jones et al. | |
| 6,850,383 B1 | 2/2005 | Bennett | |
| 7,075,373 B2 * | 7/2006 | Briskin | H03F 1/523 330/298 |
| 7,277,264 B2 * | 10/2007 | Kitagawa | H02H 7/1213 361/93.1 |
| 2012/0326615 A1 * | 12/2012 | Li | H05B 45/44 315/200 R |

* cited by examiner

*Primary Examiner* — Thang X Le
(74) *Attorney, Agent, or Firm* — Slater Matsil, LLP

(57) ABSTRACT

A current monitoring circuit includes: an output terminal configured to be coupled to a controller; an inverter having an output coupled to the output terminal; a first transconductance amplifier having first and second inputs configured to be coupled across a sense resistive element, and an output coupled to an input of the inverter; and a current generator having a second transconductance amplifier configured to generate a reference current at an output of the current generator based on a reference voltage, the output of the current generator being coupled to the input of the inverter, where the output of the inverter is configured to be in a first state when a load current flowing through the sense resistive element is higher than a predetermined threshold, and in a second state when the load current is lower than the predetermined threshold, and where the predetermined threshold is based on the reference current.

20 Claims, 5 Drawing Sheets

PRIOR ART

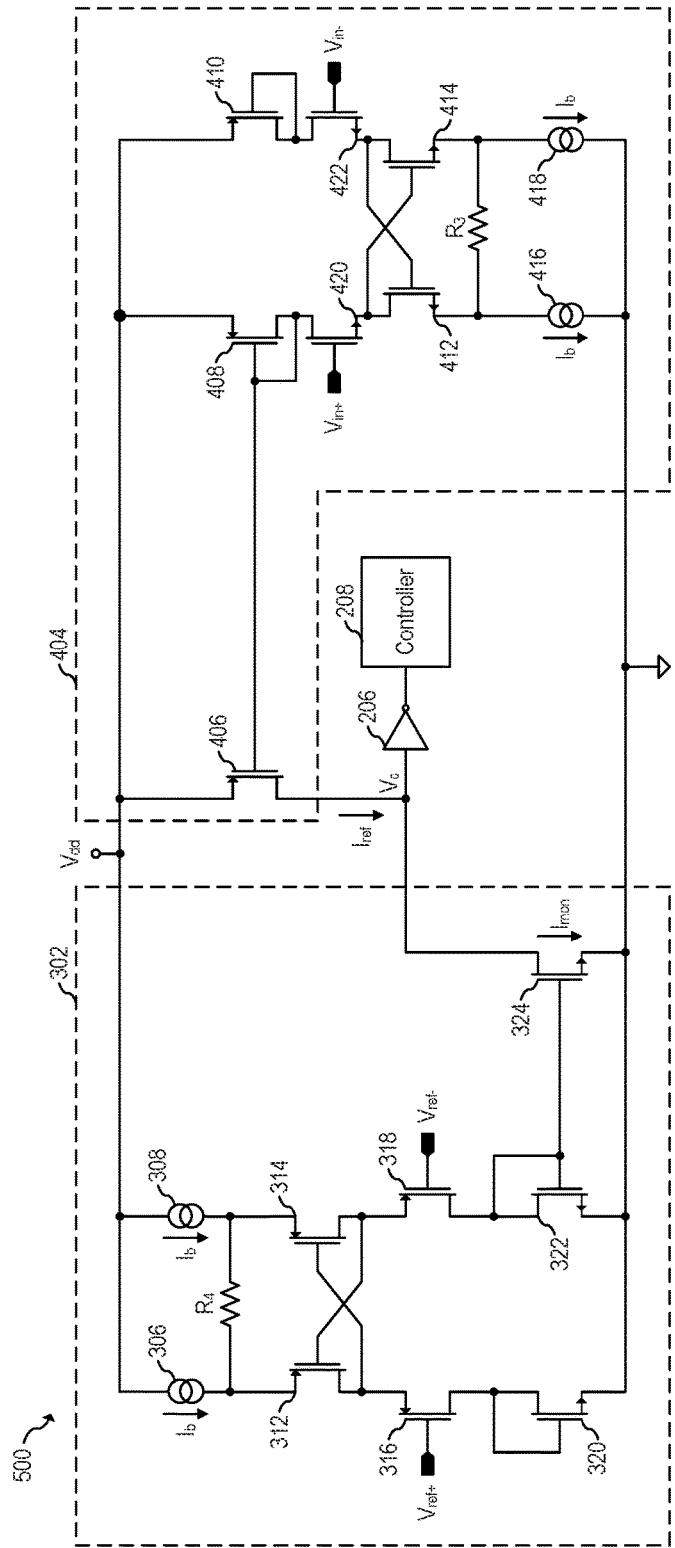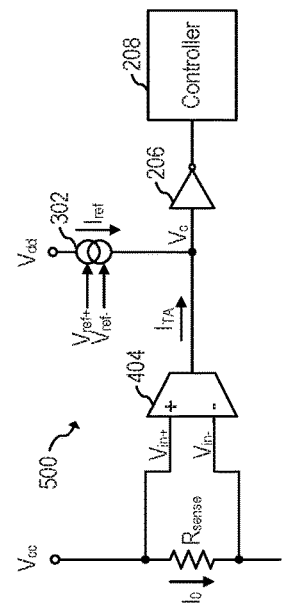
FIG. 5A
FIG. 5B

HIGH-SPEED AFE FOR CURRENT MONITORING APPLICATIONS

TECHNICAL FIELD

The present disclosure relates generally to an electronic system and method, and, in particular embodiments, to a high-speed analog front-end (AFE) for current monitoring applications.

BACKGROUND

Many electronic circuits use current sensing for many different purposes. For example, amplifiers and drivers, such as motor drivers, speaker drivers, hard-disk drivers, and other drivers often include current sensing to perform one or more functions. For example, some electronic circuits monitor a current flowing through a load to regulate the current flowing through the load to a particular value. An example of such circuit is a light emitting diode (LED) driver. Some electronic circuits measure a current flowing through a load and provide a signal indicative of the magnitude of the measured current to a controller, e.g., for further processing. Some electronic circuits monitor a current flowing through a load as part of an overcurrent protection circuit, where the overcurrent protection circuit provides an indication of an overcurrent event when the current flowing through the load is higher than a threshold.

FIG. 1 shows a schematic diagram of exemplary overcurrent protection circuit 100. Overcurrent protection circuit 100 includes sense resistor $R_{sense}$, amplifier 102, and comparator 104. During normal operation, current $I_o$ flows through sense resistor $Rs_{ense}$ and generates a voltage across resistor $R_{sense}$ that is proportional to current $I_o$. The voltage across $R_{sense}$ is amplified by amplifier 102. Comparator 104 compares the amplified voltage with a reference voltage $V_{REF}$ and generates a logic output based on whether the amplifier voltage is higher or lower than the reference voltage $V_{REF}$.

SUMMARY

In accordance with an embodiment, a current monitoring circuit includes: an output terminal configured to be coupled to a controller; an inverter having an output coupled to the output terminal; a first transconductance amplifier having first and second inputs configured to be coupled across a sense resistive element, and an output coupled to an input of the inverter; and a current generator having a second transconductance amplifier configured to generate a reference current at an output of the current generator based on a reference voltage, the output of the current generator being coupled to the input of the inverter, where the output of the inverter is configured to be in a first state when a load current flowing through the sense resistive element is higher than a predetermined threshold, and in a second state when the load current is lower than the predetermined threshold, and where the predetermined threshold is based on the reference current.

In accordance with an embodiment, a method includes: receiving an input voltage indicative of a load current flowing through a resistive element with a first transconductance amplifier; generating a first current into an input of an inverter, the first current being based on the input voltage; receiving a reference voltage with a second transconductance amplifier; generating a reference current into the input of the inverter, the reference current being based on the reference voltage; when the first current is higher than the reference current, causing an output of the inverter to be in a first state; and when the first current is lower than the reference current, causing the output of the inverter to be in a second state.

In accordance with an embodiment, an integrated circuit includes: a controller; an inverter having an output coupled to the controller; a first transconductance amplifier having first and second inputs configured to be coupled across a sense resistive element, and an output coupled to an input of the inverter; and a current generator having a second transconductance amplifier configured to generate a reference current at an output of the current generator based on a reference voltage, the output of the current generator being coupled to the input of the inverter, where the output of the inverter is configured to be in a first state when a load current flowing through the sense resistive element is higher than a predetermined threshold, and in a second state when the load current is lower than the predetermined threshold, and where the predetermined threshold is based on the reference current.

BRIEF DESCRIPTION OF THE DRAWINGS

For a more complete understanding of the present invention, and the advantages thereof, reference is now made to the following descriptions taken in conjunction with the accompanying drawings, in which:

FIGS. 5A and 5B show schematic diagrams of a current monitoring circuit suitable for high-side current sensing, according to an embodiment of the present invention;

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in a specific context, an AFE for current monitoring capable of high-side and low-side current sensing in e.g., a power management integrated circuits (PMIC) such as in a power management application-specific integrated circuit (ASIC). Embodiments of the present invention may also be used, for example, for overcurrent protection circuits of drivers, such as motor drivers, printer inkjet head-driver, and other drivers, as well as any other circuit that could benefit from fast overcurrent detection.

In an embodiment of the present invention, an AFE monitors a current flowing through a sense resistor (also known as a shunt resistor) by using a first transconductance amplifier to convert the voltage across the sense resistor into a monitoring current. A second transconductance amplifier is used to convert a reference voltage into a reference current. The monitoring current and the reference current are injected into a high impedance node that is coupled to an input of an inverter. When the monitoring current is higher than the reference current, the output of the inverter is high. When the monitoring current is lower than the reference current, the output of the inverter is low. The output of the inverter may be used to indicate an overcurrent event. By injecting the monitoring and sense currents into a high impedance node, a comparison between the monitoring current and the reference current may be performed at high speed.

Figure 2:
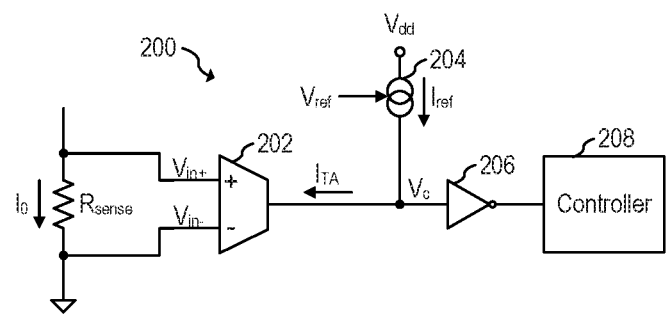
FIG. 2 shows a schematic diagram of a current monitoring circuit, according to an embodiment of the present invention.

FIG. 2 shows a schematic diagram of current monitoring circuit 200, according to an embodiment of the present invention. Current monitoring circuit 200 includes an AFE that includes transconductance amplifier 202, current generator 204 and inverter 206.

During normal operation, transconductance amplifier senses current $I_o$ by sensing a voltage across sense resistor $R_{sense}$. Transconductance amplifier 202 then generates at node $V_c$ a (e.g., pulldown) current $I_{TA}$ proportional to the voltage across sense resistor $R_{sense}$. Current generator 204 generates a (e.g., pullup) reference current $I_{ref}$ at node $V_c$. When reference current $I_{ref}$ is higher than current $I_{TA}$, node $V_c$ is pulled up and inverter 206 outputs low. Conversely, when reference current $I_{ref}$ is lower than current $I_{TA}$, node $V_c$ is pulled down and inverter 206 outputs high. The output of the inverter, therefore, signals whether current $I_{TA}$ is higher or lower than a reference current $I_{ref}$. Since current $I_{TA}$ is proportional to the voltage across sense resistor $R_{sense}$, which in turn is proportional to current $I_o$, the output of inverter 206 is indicative of whether current $I_o$ is higher or lower than a predetermined threshold (where the predetermine threshold is based on reference current $I_{ref}$, the resistance of sense resistor $R_{sense}$, and the gain of transconductance amplifier 202).

Figure 1:
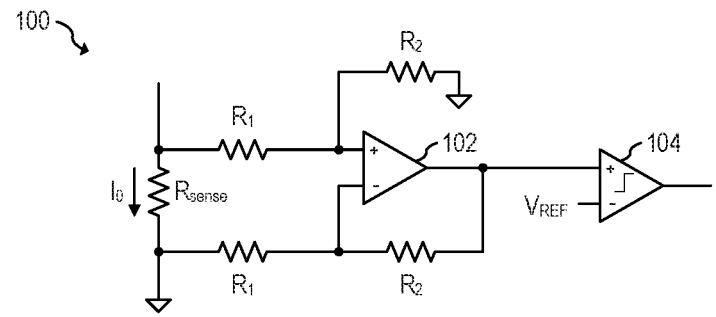
FIG. 1 shows a schematic diagram of an exemplary overcurrent protection circuit.

As shown in FIG. 2, node $V_c$ is a high impedance node that serves as input to inverter 206. Since there is only one high impedance node and transconductance amplifier 202 operates in open loop mode, the overall AFE has a wide bandwidth, thereby achieving a faster response time and without stability issues, when compared with a closed-loop circuit such as shown in FIG. 1.

The fast response time of current monitoring circuit 200 advantageously allows for a very fast detection of current $I_o$ crossing the predetermine threshold. The delay between current $I_o$ flowing through $R_{sense}$ and crossing the predetermine threshold and the output of inverter 206 changing states (e.g., from high to low or from low to high) may vary based on the technology node. For example, in some embodiments, such delay is in the order of nanoseconds. For example, in an embodiment using 0.16 µm technology platform, such delay may be between 30 ns and 40 ns.

The output of inverter 206 may be used by controller 208 for various purposes. For example, in some embodiments, controller 208 may generate a signal to indicate that current $I_o$ is higher than a predetermined threshold. Such signal may be an output of a, e.g., interrupt pin, changing a state of a register bit, for example. In some embodiments controller 208 may cause the turn-off or power reduction of a circuit generating current $I_o$ to, e.g., protect the circuit, such as when controller 208 is part of an overcurrent protection circuit.

Inverter 208 may be implemented in any way known in the art. In some embodiments, a different logic circuit may be used instead of inverter 206. For example, in some embodiments, a buffer may be used instead of inverter 206 (with appropriate changes in polarity). In other embodiments, a comparator similar to comparator 104 may be used instead of inverter 206 (where the reference voltage of such comparator may be set to, e.g., the midpoint between ground and supply voltage $V_{dd}$). Other implementations are also possible.

Controller 208 may be implemented in any way known in the art. For example, controller 208 may be implemented as a general purpose processor, controller or digital signal processor (DSP) that includes, for example, combinatorial circuits coupled to a memory. In some embodiments, controller 208 may be implemented as a custom application specific integrated circuit (ASIC). Other implementations are also possible.

Current generator 204 may be implemented, for example, with a transconductance amplifier (not shown in FIG. 2). For example, a transconductance amplifier may be used to convert reference voltage $V_{ref}$ into reference current $I_{ref}$. In some embodiments, the transconductance amplifier of current generator 204 and transconductance amplifier 202 are manufactured during the same process steps. By manufacturing the transconductance amplifiers simultaneously using the same process steps, process variations are similarly applied to both transconductance amplifiers. Any shifts in performance of transconductance amplifier 202 due to process variations, therefore, may be compensated by a similar shift in the transconductance amplifier of current generator 204. The use of a transconductance amplifier to generate reference current $I_{ref}$, therefore, advantageously allows for accurately setting a predetermined threshold that causes inverter 206 to flip.

Figure 3:
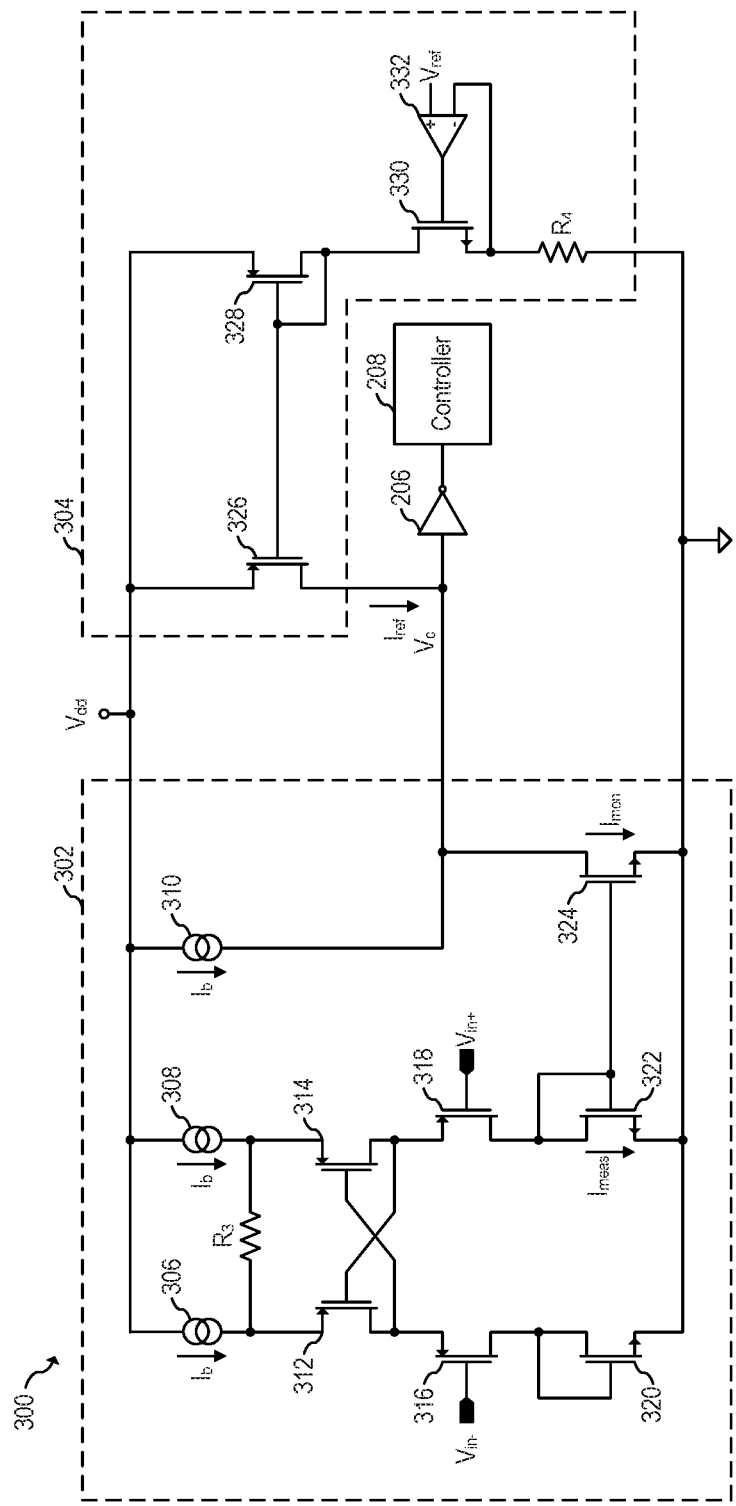
FIGS. 3 and 4 show schematic diagrams of possible implementations of the current monitoring circuit of FIG. 2, according to an embodiment of the present invention.

FIG. 3 shows a schematic diagram of current monitoring circuit 300, according to an embodiment of the present invention. Current monitoring circuit 300 is a possible implementation of current monitoring circuit 200, where transconductance amplifier 302 is a possible implementation of transconductance amplifier 202, and current generator 304 is a possible implementation of current generator 204.

During normal operation, terminals $V_{in+}$ and $V_{in-}$ receive voltages $V_{in+}$ and $V_{in-}$, respectively. Terminals $V_{in+}$ and $V_{in-}$ may be coupled, for example, across resistor $R_{sense}$, as shown in FIG. 2.

As shown in FIG. 3, transistors 318 and 316 receive voltages $V_{in+}$ and $V_{in-}$ at their respective gates. The magnitude of the difference between voltages $V_{in+}$ and $V_{in-}$ determines current $I_{meas}$ flowing through transistor 322, which is then mirrored into monitoring current $I_{mon}$. In some embodiments, the magnitude of current $I_{mon}$ is given by $$I_{mon} = \frac{V_{in+} - V_{in-}}{R_3} + I_b = \frac{V_{in}}{R_3} + I_b \quad (1)$$

where current $I_b$ is a biasing current. It is understood that the relationship between monitoring current $I_{mon}$ and voltages $V_{in+}$ and $V_{in-}$, as described in Equation 1, may be modified, for example, by altering the ratios of the current mirrors shown in FIG. 3, such as the current mirror formed by transistors 322 and 324.

During normal operation, terminal $V_{ref}$ receives reference voltage $V_{ref}$ and amplifier 332 forces a current of $$\frac{V_{ref}}{R_4}$$

to flow through transistor 328 and 330. The current flowing through transistor 330 is copied into transistor 326 to generate reference current $I_{ref}$. In some embodiments, reference current $I_{ref}$ is given by $$I_{ref} = \frac{V_{ref}}{R_4} \quad (2)$$

It is understood that the relationship between reference current $I_{ref}$ and reference voltage $V_{ref}$, as described in Equation 2, may be modified, for example, by altering the ratios of the current mirrors shown in FIG. 3, such as the current mirror formed by transistors 328 and 326.

As shown in FIG. 3, when reference current $I_{ref}$ is greater than monitoring current $I_{mon}$, node $V_c$ is high, which causes inverter 206 to output low. When reference current $I_{ref}$ is lower than monitoring current $I_{mon}$, node $V_c$ is low, which causes inverter 206 to output high.

Current generators 306, and 308 generate bias currents used to bias different portions of current monitoring circuit 300. Current generators 206, and 208 may be implemented in any way known in the art.

Transistors 312, 314, 316, 318, 320, 322, 326, and 328 may be implemented in any way known in the art. For example, in some embodiments, transistors 312, 314, 316, 318, 320, 322, 326, and 328 metal-oxide semiconductor field-effect transistors (MOSFETs).

Amplifier 332 may be implemented in any way known in the art. For example, in some embodiments, amplifier 332 may be implemented as a comparator.

Figure 4:
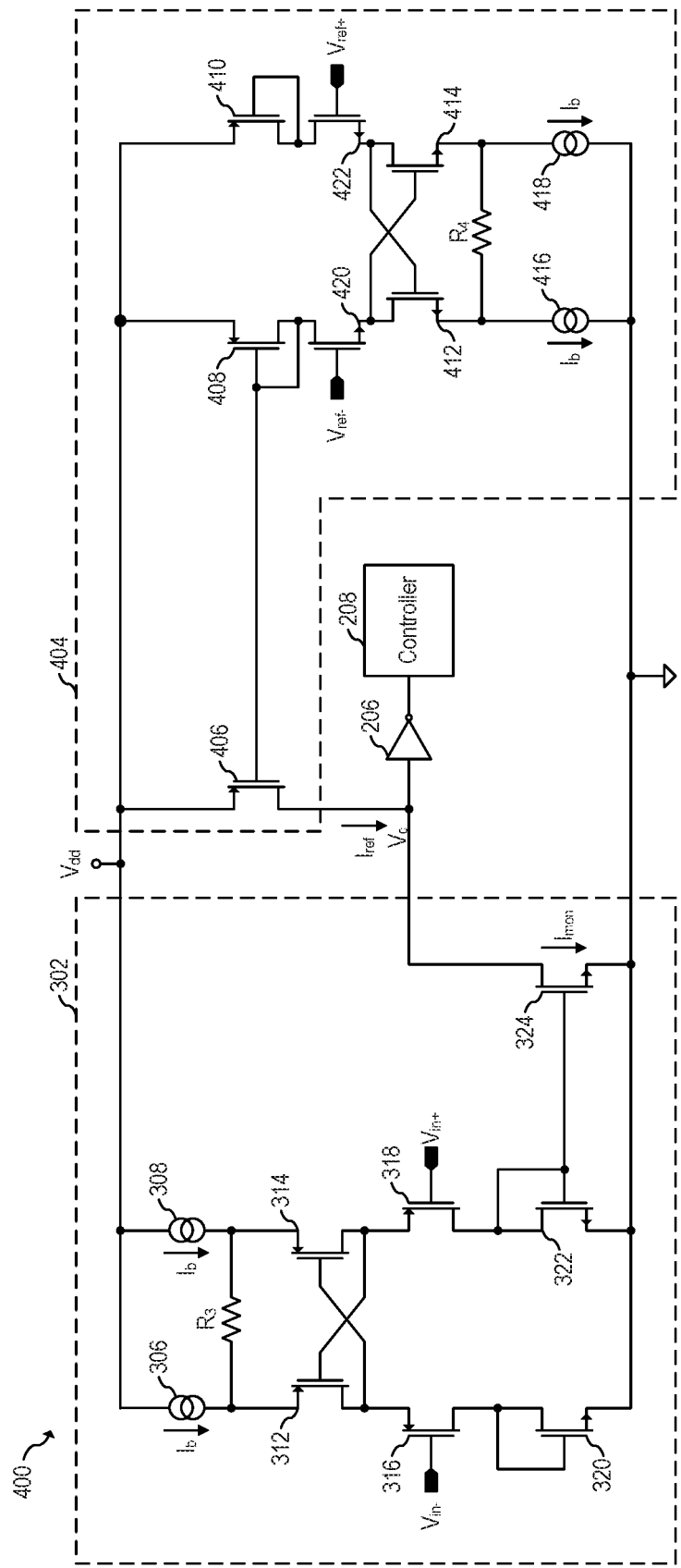

FIG. 4 shows a schematic diagram of current monitoring circuit 400, according to an embodiment of the present invention. Current monitoring circuit 400 is another possible implementation of current monitoring circuit 200. Current monitoring circuit 400 operates in a similar manner as current monitoring circuit 300. Current monitoring circuit 400, however, implements current generator 204 with current generator 404 instead of current generator 304.

As shown in FIG. 4, current generator 404 is implemented with a transconductance amplifier that has differential inputs coupled to terminals $V_{ref+}$ and $V_{ref-}$ for receiving differential reference voltages $V_{ref+}$ and $V_{ref-}$, respectively (as opposed to current generator 304, which has a single ended input receiving reference voltage $V_{ref}$). Equation 2 also applies to current generator 404, where $V_{ref}=V_{ref+}-V_{ref-}$. In some embodiments, terminal $V_{ref-}$ may be connected to ground.

Current monitoring circuits 300 and 400 are suitable for low-side current sensing (e.g., as shown in FIG. 2). FIG. 5A shows a schematic diagram of current monitoring circuit 500, which is suitable for high-side current sensing, according to an embodiment of the present invention. As shown in FIG. 5A, the hardware implementation of current monitoring circuit 500 is very similar or identical to current monitoring circuits 400. Current monitoring circuit 500, however, has terminals $V_{in+}$ and $V_{in-}$ coupled to the differential inputs of the transconductance amplifier of circuit 404 while terminals $V_{ref+}$ and $V_{ref-}$ are coupled to the differential inputs of transconductance amplifier 302.

FIG. 5B shows a schematic diagram of current monitoring circuit 500 coupled to a high-side sense resistor, according to an embodiment of the present invention. In some embodiments, supply voltage $V_{cc}$ may be the same as supply voltage $V_{dd}$. In other embodiments, supply voltage $V_{cc}$ may be different (higher or lower) than supply voltage $V_{dd}$.

Figure 6:
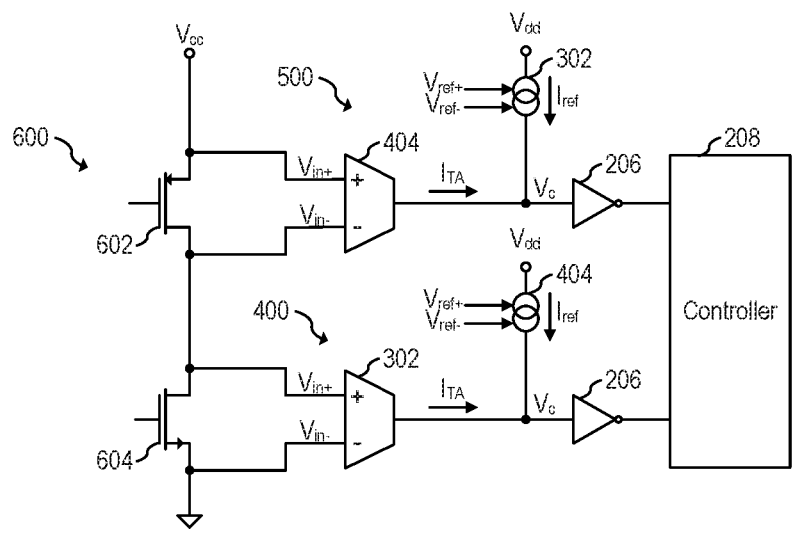
FIG. 6 shows a half-bridge having high-side and low-side current sensing, according to an embodiment of the present invention.

As can be seen from FIGS. 4 and 5A, the same current monitoring circuit design may be implemented to perform high-side current sensing and low-side current sensing in the same integrated circuit. For example, FIG. 6 shows half-bridge 600 having high-side and low-side current sensing, according to an embodiment of the present invention. Half-bridge 600 may be, for example, a half-bridge of a class-AB amplifier. As shown in FIG. 6, current monitoring circuits 400 and 500 are used for low-side and high-side current sensing, respectively.

Figure 7:
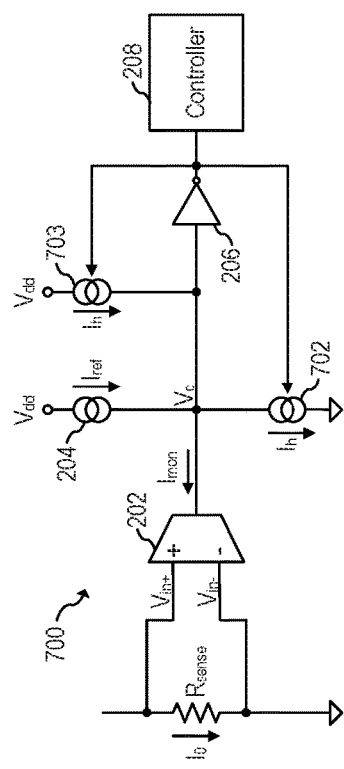
FIG. 7 shows a schematic diagram of a current monitoring circuit having hysteresis, according to an embodiment of the present invention.

In some embodiments, any of current monitoring circuits 200, 300, 400, or 500 may be implemented with hysteresis. For example, FIG. 7 shows a schematic diagram of current monitoring circuit 700 having hysteresis, according to an embodiment of the present invention. As shown in FIG. 7, current monitoring circuit 700 includes controllable current generator 702.

During normal operation, when the output of inverter 206 is low, current generator 702 is off, current generator 703 is on, and hysteresis current $I_h$ is added to $I_{ref}$. When the output of inverter 206 is high (e.g., because current $I_{mon}$ becomes higher than reference current $I_{ref}+I_h$), current generator 703 turns off, current generator 702 turns on and hysteresis current I is added to current $I_{mon}$ in pulling down node $V_c$, thereby producing a hysteresis effect. The amount of hysteresis is based on the magnitude of hysteresis current $I_h$. Although FIG. 7 shows the current flowing through current generators 702 and 703 to be equal when the respective current generator 702 or 703 is on (e.g., $I_h$), in some embodiments, the currents flowing through current generators 702 and 703 may be different. For example, in some embodiments, the current flowing through current generator 702 when current generator 702 is on may be higher than the current flowing through current generator 703 when current generator 703 is on. In other embodiments, the current flowing through current generator 702 when current generator 702 is on may be lower than the current flowing through current generator 703 when current generator 703 is on.

Although current monitoring circuit 700 is shown with respect to a low-side sensing, it is understood that a high-side sensing current monitoring circuit, such as current monitoring circuit 600, can also implement hysteresis in a similar manner. Adding hysteresis to a current monitoring circuit, such as current monitoring circuits 200, 300, 400, 500, or 600, advantageously allows avoiding possible oscillations that may be caused by the reference current $I_{ref}$ being substantially equal to monitoring current $I_{mon}$.

Figure 8:
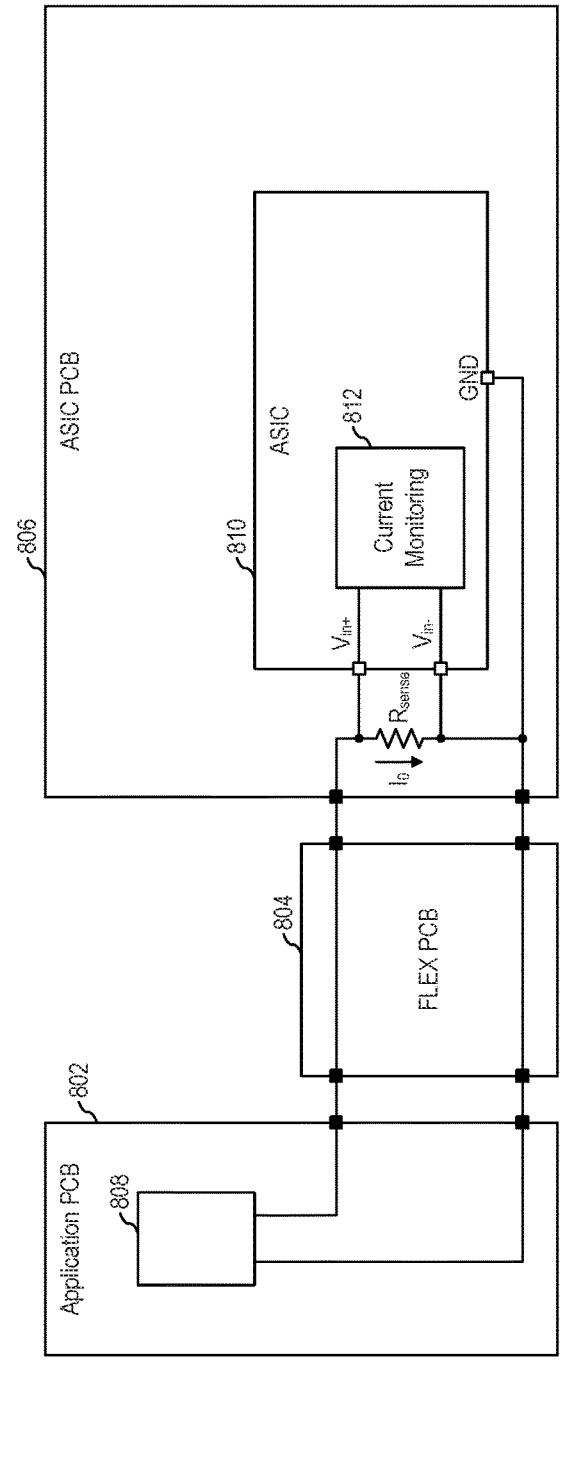
FIG. 8 shows an electronic device, according to an embodiment of the present invention.

FIG. 8 shows electronic device 800, according to an embodiment of the present invention. Electronic device 800 includes application printed circuit board (PCB) 802, ASIC PCB 806, and flex PCB 804. Application PCB 802 includes circuit 808. ASIC PCB 806 includes ASIC 810.

As shown in FIG. 8, current monitoring circuit 812 is sensing current from circuit 808 using sense resistor $R_{sense}$ via flex PCB 804. Current monitoring circuit 812 may be implemented, for example, with current monitoring circuits 200, 300, 400, or 700, for example. Using a current monitoring circuit such as current monitoring circuits 200, 300, 400, or 700, advantageously allows for accurately determining an overcurrent event at high speed, even when the load generating the current being monitored is in a different PCB than the current monitoring circuit.

Even though current monitoring circuit 812 is shown as a low-side current sensing monitoring circuit, it is understood that a high-side sensing current monitoring circuit, such as current monitoring circuit 500, may also be used in an electronic device, such as electronic device 800.

ASIC 810 may be implemented in a monolithic semiconductor substrate in a single package. In some embodiments, ASIC 810 may be implemented in multiple semiconductor substrates packaged in a single package. Other implementations are also possible.

Example embodiments of the present invention are summarized here. Other embodiments can also be understood from the entirety of the specification and the claims filed herein.

Example 1. A current monitoring circuit including: an output terminal configured to be coupled to a controller; an inverter having an output coupled to the output terminal; a first transconductance amplifier having first and second inputs configured to be coupled across a sense resistive element, and an output coupled to an input of the inverter; and a current generator having a second transconductance amplifier configured to generate a reference current at an output of the current generator based on a reference voltage, the output of the current generator being coupled to the input of the inverter, where the output of the inverter is configured to be in a first state when a load current flowing through the sense resistive element is higher than a predetermined threshold, and in a second state when the load current is lower than the predetermined threshold, and where the predetermined threshold is based on the reference current.

Example 2. The current monitoring circuit of example 1, where the first transconductance amplifier includes: a first transistor having a control terminal coupled to the first input of the first transconductance amplifier; a second transistor having a control terminal coupled to the second input of the first transconductance amplifier; a third transistor having a current path coupled between a first supply terminal and a current path of the first transistor, where a control terminal of the third transistor is coupled to a current path of the second transistor; a fourth transistor having a current path coupled between the first supply terminal and the current path of the second transistor, where a control terminal of the fourth transistor is coupled to the current path of the first transistor; a first resistive element coupled between the current path of the third transistor and the current path of the fourth transistor; and a first current mirror coupled between the current path of the first transistor and the output of the first transconductance amplifier.

Example 3. The current monitoring circuit of one of examples 1 or 2, where the current generator includes: a second resistive element; a first amplifier having a first input configured to receive the reference voltage, and a second input coupled to the second resistive element; a fifth transistor having a current path coupled to the second resistive element and a control terminal coupled to an output of the first amplifier; and a second current mirror coupled between the current path of the fifth transistor and the output of the current generator.

Example 4. The current monitoring circuit of one of examples 1 to 3, where the reference voltage includes a differential reference voltage having a first reference voltage and a second reference voltage, and where the current generator includes: a fifth transistor having a control terminal configured to receive the first reference voltage; a sixth transistor having a control terminal configured to receive the second reference voltage; a seventh transistor having a current path coupled to a current path of the fifth transistor and a control terminal coupled to a current path of the sixth transistor; an eighth transistor having a current path coupled to the current path of the sixth transistor and a control terminal coupled to the current path of the fifth transistor; a second resistive element coupled between the current path of the seventh transistor and the current path of the eighth transistor; and a current mirror coupled between the current path of the fifth transistor and the input of the inverter.

Example 5. The current monitoring circuit of one of examples 1 to 4, where the second reference voltage is ground.

Example 6. The current monitoring circuit of one of examples 1 to 5, where the first, second, third, and fourth transistors are transistors of the n-type.

Example 7. The current monitoring circuit of one of examples 1 to 6, where the first state is high and the second state is low.

Example 8. The current monitoring circuit of one of examples 1 to 7, further including the controller configured to generate a signal indicative of an overcurrent event based on the output of the inverter.

Example 9. The current monitoring circuit of one of examples 1 to 8, further including the sense resistive element coupled between the first and second inputs of the first transconductance amplifier.

Example 10. The current monitoring circuit of one of examples 1 to 9, where the sense resistive element includes a transistor.

Example 11. The current monitoring circuit of one of examples 1 to 10, where the sense resistive element has a first terminal directly connected to ground.

Example 12. The current monitoring circuit of one of examples 1 to 11, further including a hysteresis current generator coupled to the input of the inverter, the output of the inverter configured to control the hysteresis current generator.

Example 13. A method including: receiving an input voltage indicative of a load current flowing through a resistive element with a first transconductance amplifier; generating a first current into an input of an inverter, the first current being based on the input voltage; receiving a reference voltage with a second transconductance amplifier; generating a reference current into the input of the inverter, the reference current being based on the reference voltage; when the first current is higher than the reference current, causing an output of the inverter to be in a first state; and when the first current is lower than the reference current, causing the output of the inverter to be in a second state.

Example 14. The method of example 13, where the resistive element has a first terminal directly connected to ground, the method further including: receiving a second input voltage indicative of a second load current flowing through a second resistive element with a third transconductance amplifier, the third transconductance amplifier being identical to the second transconductance amplifier; generating a second current into an input of a second inverter, the second current being based on the second input voltage; receiving a second reference voltage with a fourth transconductance amplifier, the fourth transconductance amplifier being identical to the first transconductance amplifier; generating a second reference current into the input of the second inverter, the second reference current being based on the second reference voltage; when the second current is higher than the second reference current, causing an output of the second inverter to be in the first state; and when the second current is lower than the reference current, causing the output of the second inverter to be in the second state.

Example 15. An integrated circuit including: a controller; an inverter having an output coupled to the controller; a first transconductance amplifier having first and second inputs configured to be coupled across a sense resistive element, and an output coupled to an input of the inverter; and a current generator having a second transconductance amplifier configured to generate a reference current at an output of the current generator based on a reference voltage, the output of the current generator being coupled to the input of the inverter, where the output of the inverter is configured to be in a first state when a load current flowing through the sense resistive element is higher than a predetermined threshold, and in a second state when the load current is lower than the predetermined threshold, and where the predetermined threshold is based on the reference current.

Example 16. The integrated circuit of example 15, further including the sense resistive element coupled between the first and second inputs of the first transconductance amplifier.

Example 17. The integrated circuit of one of examples 15 or 16, where the sense resistive element includes a resistor.

Example 18. The integrated circuit of one of examples 15 to 17, where the sense resistive element has a terminal directly connected to ground, the integrated circuit further including: a second inverter having an output coupled to the controller; a third transconductance amplifier having first and second inputs configured to be coupled across a second sense resistive element, and an output coupled to an input of the inverter the third transconductance amplifier being identical to the second transconductance amplifier, the second sense resistive element having a terminal coupled to a supply terminal configured to receive a voltage higher than ground; and a second current generator having a fourth transconductance amplifier configured to generate a second reference current at an output of the second current generator based on a second reference voltage, the output of the second current generator being coupled to the input of the second inverter, where the output of the second inverter is configured to be in the first state when a second load current flowing through the second sense resistive element is higher than a second predetermined threshold, and in the second state when the second load current is lower than the second predetermined threshold, and where the second predetermined threshold is based on the second reference current.

Example 19. The integrated circuit of one of examples 15 to 18, where the first and second transconductance amplifiers are formed during the same manufacturing steps.

Example 20. The integrated circuit of one of examples 15 to 19, where the controller is configured to generate a signal indicative of an overcurrent event when the output of the inverter is in the first state.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current monitoring circuit comprising:
    an output terminal configured to be coupled to a controller;
    an inverter having an output coupled to the output terminal;
    a first transconductance amplifier having first and second inputs configured to be coupled across a sense resistive element, and an output coupled to an input of the inverter; and
    a current generator having a second transconductance amplifier configured to generate a reference current at an output of the current generator based on a reference voltage, the output of the current generator being coupled to the input of the inverter, wherein the output of the inverter is configured to be in a first state when a load current flowing through the sense resistive element is higher than a predetermined threshold, and in a second state when the load current is lower than the predetermined threshold, and wherein the predetermined threshold is based on the reference current.

2. The current monitoring circuit of claim 1, wherein the first transconductance amplifier comprises:
    a first transistor having a control terminal coupled to the first input of the first transconductance amplifier;
    a second transistor having a control terminal coupled to the second input of the first transconductance amplifier;
    a third transistor having a current path coupled between a first supply terminal and a current path of the first transistor, wherein a control terminal of the third transistor is coupled to a current path of the second transistor;
    a fourth transistor having a current path coupled between the first supply terminal and the current path of the second transistor, wherein a control terminal of the fourth transistor is coupled to the current path of the first transistor;
    a first resistive element coupled between the current path of the third transistor and the current path of the fourth transistor; and
    a first current mirror coupled between the current path of the first transistor and the output of the first transconductance amplifier.

3. The current monitoring circuit of claim 2, wherein the current generator comprises:
    a second resistive element;
    a first amplifier having a first input configured to receive the reference voltage, and a second input coupled to the second resistive element;

a fifth transistor having a current path coupled to the second resistive element and a control terminal coupled to an output of the first amplifier; and a second current mirror coupled between the current path of the fifth transistor and the output of the current generator.

4. The current monitoring circuit of claim 2, wherein the reference voltage comprises a differential reference voltage having a first reference voltage and a second reference voltage, and wherein the current generator comprises:

a fifth transistor having a control terminal configured to receive the first reference voltage;

a sixth transistor having a control terminal configured to receive the second reference voltage;

a seventh transistor having a current path coupled to a current path of the fifth transistor and a control terminal coupled to a current path of the sixth transistor;

an eighth transistor having a current path coupled to the current path of the sixth transistor and a control terminal coupled to the current path of the fifth transistor;

a second resistive element coupled between the current path of the seventh transistor and the current path of the eighth transistor; and a current mirror coupled between the current path of the fifth transistor and the input of the inverter.

5. The current monitoring circuit of claim 4, wherein the second reference voltage is ground.

6. The current monitoring circuit of claim 2, wherein the first, second, third, and fourth transistors are transistors of the n-type.

7. The current monitoring circuit of claim 1, wherein the first state is high and the second state is low.

8. The current monitoring circuit of claim 1, further comprising the controller configured to generate a signal indicative of an overcurrent event based on the output of the inverter.

9. The current monitoring circuit of claim 1, further comprising the sense resistive element coupled between the first and second inputs of the first transconductance amplifier.

10. The current monitoring circuit of claim 9, wherein the sense resistive element comprises a transistor.

11. The current monitoring circuit of claim 9, wherein the sense resistive element has a first terminal directly connected to ground.

12. The current monitoring circuit of claim 1, further comprising a hysteresis current generator coupled to the input of the inverter, the output of the inverter configured to control the hysteresis current generator.

13. A method comprising:

receiving an input voltage indicative of a load current flowing through a resistive element with a first transconductance amplifier;

generating a first current into an input of an inverter, the first current being based on the input voltage;

receiving a reference voltage with a second transconductance amplifier;

generating a reference current into the input of the inverter, the reference current being based on the reference voltage;

when the first current is higher than the reference current, causing an output of the inverter to be in a first state; and when the first current is lower than the reference current, causing the output of the inverter to be in a second state.

14. The method of claim 13, wherein the resistive element has a first terminal directly connected to ground, the method further comprising:

receiving a second input voltage indicative of a second load current flowing through a second resistive element with a third transconductance amplifier, the third transconductance amplifier being identical to the second transconductance amplifier;

generating a second current into an input of a second inverter, the second current being based on the second input voltage;

receiving a second reference voltage with a fourth transconductance amplifier, the fourth transconductance amplifier being identical to the first transconductance amplifier;

generating a second reference current into the input of the second inverter, the second reference current being based on the second reference voltage;

when the second current is higher than the second reference current, causing an output of the second inverter to be in the first state; and when the second current is lower than the reference current, causing the output of the second inverter to be in the second state.

15. An integrated circuit comprising:

a controller;

an inverter having an output coupled to the controller;

a first transconductance amplifier having first and second inputs configured to be coupled across a sense resistive element, and an output coupled to an input of the inverter; and a current generator having a second transconductance amplifier configured to generate a reference current at an output of the current generator based on a reference voltage, the output of the current generator being coupled to the input of the inverter, wherein the output of the inverter is configured to be in a first state when a load current flowing through the sense resistive element is higher than a predetermined threshold, and in a second state when the load current is lower than the predetermined threshold, and wherein the predetermined threshold is based on the reference current.

16. The integrated circuit of claim 15, further comprising the sense resistive element coupled between the first and second inputs of the first transconductance amplifier.

17. The integrated circuit of claim 16, wherein the sense resistive element comprises a resistor.

18. The integrated circuit of claim 15, wherein the sense resistive element has a terminal directly connected to ground, the integrated circuit further comprising:

a second inverter having an output coupled to the controller;

a third transconductance amplifier having first and second inputs configured to be coupled across a second sense resistive element, and an output coupled to an input of the inverter the third transconductance amplifier being identical to the second transconductance amplifier, the second sense resistive element having a terminal coupled to a supply terminal configured to receive a voltage higher than ground; and a second current generator having a fourth transconductance amplifier configured to generate a second reference current at an output of the second current generator based on a second reference voltage, the output of the second current generator being coupled to the input of the second inverter, wherein the output of the second inverter is configured to be in the first state when a second load current flowing through the second sense resistive element is higher than a second predetermined threshold, and in the second state when the second load current is lower than the second predetermined threshold, and wherein the second predetermined threshold is based on the second reference current.

19. The integrated circuit of claim 15, wherein the first and second transconductance amplifiers are formed during the same manufacturing steps.

20. The integrated circuit of claim 15, wherein the controller is configured to generate a signal indicative of an overcurrent event when the output of the inverter is in the first state.

\* \* \* \* \*